United States Patent
Pedersen

(10) Patent No.: US 9,065,411 B2
(45) Date of Patent: Jun. 23, 2015

(54) ADAPTIVE SOUND FIELD CONTROL

(75) Inventor: Jan Abildgaard Pedersen, Holstebro (DK)

(73) Assignee: BANG & OLUFSEN A/S, Struer (DK)

( * ) Notice: Subject to any disclaimer, the term of this patent is extended or adjusted under 35 U.S.C. 154(b) by 292 days.

(21) Appl. No.: 13/702,120

(22) PCT Filed: Dec. 6, 2010

(86) PCT No.: PCT/EP2010/068934
§ 371 (c)(1),
(2), (4) Date: Dec. 5, 2012

(87) PCT Pub. No.: WO2012/003894
PCT Pub. Date: Jan. 12, 2012

(65) Prior Publication Data
US 2013/0101137 A1  Apr. 25, 2013

(30) Foreign Application Priority Data
Jul. 9, 2010 (DK) .................................. 2010 00609

(51) Int. Cl.
*G03G 5/00* (2006.01)
*H03G 5/16* (2006.01)
(Continued)

(52) U.S. Cl.
CPC ............... *H03G 5/165* (2013.01); *H04R 3/04* (2013.01); *H04R 29/001* (2013.01); *H04R 2499/13* (2013.01); *H04S 7/30* (2013.01); *H04S 7/301* (2013.01); *H04S 7/302* (2013.01); *H04S 7/40* (2013.01)

(58) Field of Classification Search
None
See application file for complete search history.

(56) References Cited

U.S. PATENT DOCUMENTS

| | | | |
|---|---|---|---|
| 6,731,760 B2 * | 5/2004 | Pedersen | 381/59 |
| 6,760,451 B1 | 7/2004 | Craven et al. | |
| 8,094,826 B2 * | 1/2012 | Pedersen | 381/58 |

FOREIGN PATENT DOCUMENTS

| | | |
|---|---|---|
| EP | 0772374 | 5/1997 |
| EP | 2161950 | 3/2010 |

(Continued)

OTHER PUBLICATIONS

International Search Report from PCT/EP2010/068934 (published as WO 2012/003894) dated Mar. 17, 2011; 3 pages. The instant application is a national phase of PCT/EP2010/068934 (WO2012/003894).

(Continued)

*Primary Examiner* — Andrew L Sniezek
(74) *Attorney, Agent, or Firm* — Harness, Dickey & Pierce, P.L.C.

(57) ABSTRACT

The present invention relates to methods and systems for determining an equalization filter for one or more loudspeakers provided in an enclosure, such as a listening room or an automobile cabin. A method for determining an equalization filter for one or more loudspeakers provided in an enclosure comprises the steps of providing the one or more loudspeakers with an audio input signal whereby a sound field is generated in the enclosure; determining an acoustic contribution or room gain of the enclosure to the generated sound field; forming a speaker equalization filter as the square root of the ratio between a target acoustic power output and the actual acoustic power output from the loudspeaker driver(s), which actual acoustic power output is calculated as the square of the power averaged sound pressure divided by the room gain; and determining the equalization filter as the speaker equalization filter.

17 Claims, 3 Drawing Sheets

(51) Int. Cl.
*H04R 3/04* (2006.01)
*H04R 29/00* (2006.01)
*H04S 7/00* (2006.01)

(56) References Cited

FOREIGN PATENT DOCUMENTS

| WO | 00/21331 | 4/2000 |
|---|---|---|
| WO | 2005/109954 | 11/2005 |
| WO | 2007/076863 | 7/2007 |

OTHER PUBLICATIONS

International Preliminary Report on Patentability from PCT/EP2010/068934 dated Nov. 16, 2012; 11 pgs.
"Natural Timbre in Room Correction Systems", J.A. Pedersen and H.G. Mortensen; AES Convention 122; May 5-8, 2007; 11 pgs.
"Loudspeaker-Room Adaptation for a specific Listening Position using Information about the Complete Sound Field", J.A. Pedersen; AES Convention 121; Oct. 5-8, 2008; 11 pgs.
"Adjusting a loudspeaker to its acoustic environment", J.A. Pedersen; AES Convention 115; Oct. 10-13, 2003; 13 pgs.

\* cited by examiner

ADAPTIVE SOUND FIELD CONTROL

CROSS-REFERENCE TO RELATED APPLICATIONS

This patent application is a U.S. national stage filing under 35 U.S.C. §371 of International Application No. PCT/EP2010/068934 filed Dec. 6, 2010 (published as WO 2012/003894), and claims priority to Denmark Application No. PA 2010 00609 filed Jul. 9, 2010. The disclosures of the aforementioned applications are incorporated herein by reference in their entireties.

TECHNICAL FIELD

The invention relates generally to a method and a system for controlling loudspeakers in a room and more specifically to such methods and systems optimised for use in small and/or closed enclosures, such as the cabin of a vehicle, for instance a car.

BACKGROUND OF THE INVENTION

Methods and systems having the capability to adjust a speaker system to its environment are known within the art. Such methods and systems comprise for instance single point room equalization, obtained by measuring sound pressure in one point near the listening position and subsequent direct inverse filtering. Another prior art procedure comprises adjusting a loudspeaker to its acoustic environment and controlling the acoustic energy in the sound field. Still another procedure comprises adjusting the loudspeaker according to the listening position

SUMMARY OF THE INVENTION

According to a first aspect of the present invention there is provided a method for controlling one or more loudspeakers provided in an enclosure, such as a listening room or an automobile cabin, the method comprising the steps of:
(i) providing said one or more loudspeakers with an audio input signal whereby a sound field is generated in the enclosure, and determining the corresponding acoustic power output APO(f) emitted from the one or more loudspeakers into said enclosure;
(ii) determining an acoustic contribution or room gain RG(f) of the enclosure to the generated sound field;
(iii) optionally determining a listening position interface LPI(f) that characterises a listener's ability to receive sound energy from a sound field at the specific place in the sound field, in which he is located;
(iv) determining a filter characteristic as a function of the acoustic power output, the acoustic contribution of the enclosure to the sound field in the enclosure and optionally the listening position interface between the sound field at the listening position and a listener placed at this position.

According to an embodiment of the method according to the invention, the acoustic power output APO(f) from the one of more loudspeakers is determined by power averaging of measured sound pressures at a plurality of random positions scattered over substantially the entire internal space of said enclosure.

According to an embodiment of the method according to the invention, the acoustic contribution RG(f) of the enclosure to the sound field in the enclosure is determined by carrying out the following steps:

(i) placing a sound source, such as a dedicated measurement loudspeaker, at a measurement position in the enclosure;
(ii) measuring sound pressure at a plurality of positions within the enclosure while emitting an acoustic signal by means of said sound source;
(iii) calculating the power averaged sound pressure of the sound pressures at said plurality of positions;
(iv) while keeping the sound source at said measurement position, measuring sound pressures $p_1$ and $p_2$ at two different positions in the near field of the sound source;
(v) based on the measured sound pressures at said two positions calculating the radiation resistance $R_r$ in the near field of the sound source;
(vi) based on said radiation resistance $R_r$ calculating the acoustic power output from the sound source;
(vii) calculating said acoustic contribution of the enclosure to the generated sound field as the ratio between the square of the power averaged sound pressure of the sound pressures at said plurality of positions and said acoustic power output from the measurement sound source.

According to an embodiment of the method according to the invention, said listening position interface LPI(f) is determined by placing a measurement sound source at an actual listening position in said room or enclosure and calculating the radiation resistance in the near field of the measurement sound source based on measurements of sound pressures $p_1$ and $p_2$, respectively, at two positions, respectively. The listening position interface is then determined as a function of the ratio between the radiation resistance determined at a reference listening position and the radiation resistance determined at said actual listening position.

According to a specific embodiment of the method according to the invention, the listening position interface is the square root of the ratio between the radiation resistance determined at a reference listening position and the radiation resistance determined at said actual listening position.

According to a specific embodiment of the method according to the invention, the reference listening position is a position in free field.

According to an embodiment of the method according to the invention, said filter characteristic is determined as the product of a speaker equalization filter, Speaker(f), and a listening position interface equalization filter, Listener(f), wherein the speaker equalization filter ensures the generation of a desired sound field in the enclosure while the listening position interface equalization filter compensates for the actual access at the listening position to the generated sound field.

According to an advantageous embodiment of the method according to the invention, a first subset of those quantities that are needed for determining the speaker equalization filter, Speaker(f), and the listening position interface equalization filter, Listener(f), are measured during an initial calibration process and stored in storage means corresponding to different conditions of the enclosure, and a second subset of said quantities is determined in real time during actual use of the enclosure.

According to a particularly advantageous embodiment, said second subset of quantities is determined in fewer positions in the enclosure than those used for determining the same quantities during said initial calibration process.

According to a second aspect of the present invention, there is provided a system for controlling one or more loudspeakers provided in an enclosure, such as a listening room or an automobile cabin, the system comprising:
(a) one or more microphones for measuring sound pressure at different positions in a sound field in an enclosure;

(b) a measurement sound source that can be placed at chosen positions in said sound field in said enclosure;

(c) means for, based on said measured sound pressures, determining the acoustic power output APO(f) emitted from one or more loudspeakers into said enclosure, said one or more loudspeakers generating a sound field in the enclosure;

(d) means for determining an acoustic contribution RG(f) of the enclosure to the generated sound field based on a sound signal emitted by said measurement sound source and the measurement of sound pressure in the near field of said measurement sound source at two positions at different distances from the measurement sound source;

(e) means for determining a listening position interface LPI(f) that characterises a listener's ability to receive sound energy from a sound field at the specific place in the sound field, in which he is located, said determination of ILP(f) being based on a sound signal emitted by said measurement sound source and the measurement of sound pressure in the near field of said measurement sound source at two positions at different distances from the measurement sound source, where the measurement sound source is placed at a listener position in said enclosure, (f) means for determining a filter characteristic as a function of the acoustic power output, the acoustic contribution of the enclosure to the sound field in the enclosure and the listening position interface between the sound field at the listening position and a listener placed at this position.

According to an embodiment of the system of the invention, said filter characteristic is a function of a speaker equalization filter, Speaker(f), and a listening position interface equalization filter, Listener(f).

According to an embodiment of the system of the invention, the system further comprises means for storing said speaker equalization filter, Speaker(f), and said listening position interface equalization filter, Listener(f) corresponding to different conditions of said enclosure, or means for storing those quantities that are derived from measurements of said sound pressures in the enclosure and that are used for determining the speaker equalization filter, Speaker(f), and a listening position interface equalization filter, Listener(f).

According to an advantageous embodiment of the system according to the invention, the system further comprises a set of microphones that can carry out real time measurements of sound pressure during use of the enclosure and use these measurements together with appropriately stored quantities to determine real time changes of said filter characteristic or said speaker equalization filter, Speaker(f), and a listening position interface equalization filter, Listener(f).

According to still an advantageous embodiment of the system according to the invention, the system further comprises means for triggering said real time changes of filter characteristics, for instance when the acoustic properties of the enclosure change, or when the acoustic properties of the loudspeakers that create the acoustic field in the enclosure change.

Said triggering is performed manually by an operator, such as by the driver or a passenger in a car or performed automatically, for instance by opening of a window in a car, or when the number of persons in the cabin changes.

The present invention differentiates from the prior art at least with respect to the following aspects:
  Adjustment of the performance in the full audible frequency range.
  According to the invention there are provided a number of individual options for adjustment, such as:
    Acoustic power output (distributed energy);
    Room gain, which may vary according to the actual room design;
    Optimal listening position;
    Listening position combined with supplemental measurements in several positions;
    Real-time adaption, by applying a subset of measurement points from the complete set of possible measurement points;
    Pre-shaped adjustments according to predefined knowledge data.

A specific embodiment of the method and system according to the invention will be described in detail in the following, but it is understood that other embodiments, for instance of the various functional entities used in the method and system would also be possible and would fall within the scope of the present invention.

BRIEF DESCRIPTION OF THE DRAWINGS

The present invention will be better understood by reading the following detailed description of an embodiment of the invention in conjunction with the drawings, wherein.

DETAILED DESCRIPTION OF THE INVENTION

In the following, a specific embodiment of the invention will be described in detail, but it is understood that this embodiment only constitutes an example of how the general concepts of the present invention can be implemented in practice.

A basic concept of the present invention is that the total transmission path from the electrical input terminal(s) of the loudspeaker(s) to the sound pressure generated at the ears of a listener in an enclosure can be described to constitute three main elements: (i) the acoustic power emitted from the one or more loudspeakers into the enclosure when the one or more loudspeakers are provided with electrical input signals, (ii) the influence of the acoustic properties of the enclosure itself on the sound field created in the enclosure, i.e. on the distribution of sound pressure and hence on average sound pressure generated in the enclosure by the one or more loudspeakers emitting acoustic power into the enclosure, and (iii) the coupling or interface between the created sound field in the enclosure and a listener located at a given position in the enclosure. This is illustrated with reference to FIG. 1 that shows the three elements that participate in creating a sound field 10 in an enclosure 1 such S as a listening room or automobile cabin. An example of how these three elements can be measured in practice is illustrated with reference to FIGS. 2 through 6.

Figure 1:
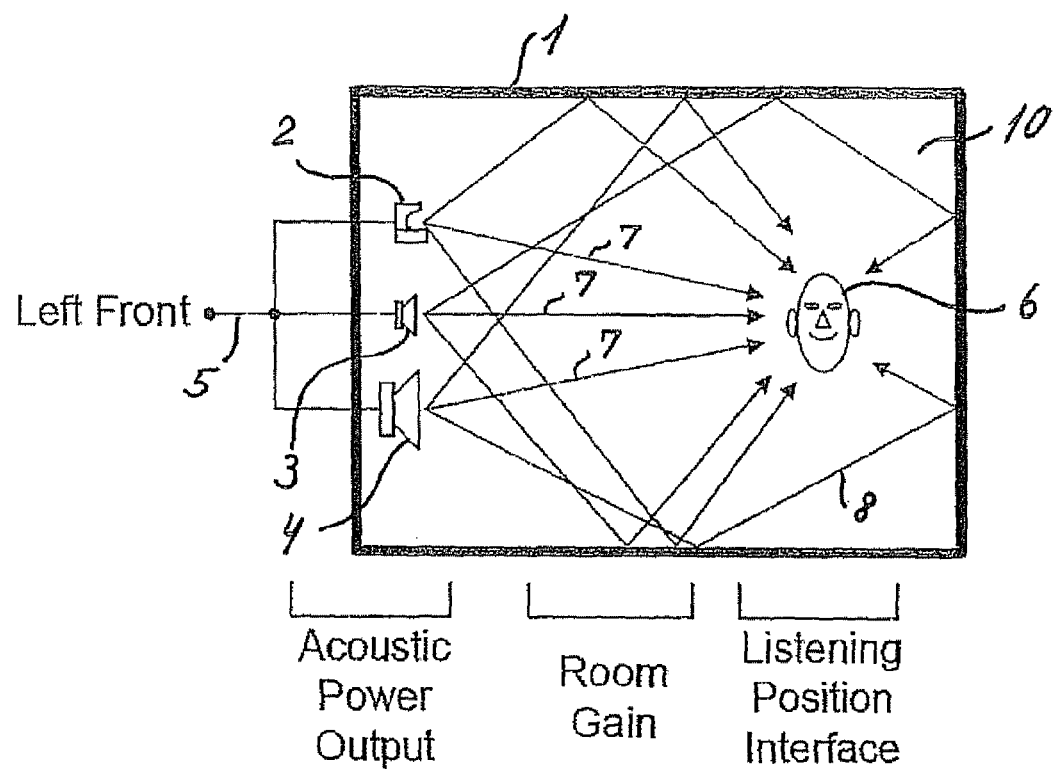
FIG. 1 shows the three main elements (the acoustic power output from the loudspeakers, the room gain and the listening position interface) of the present invention.

As shown in FIG. 1, one or more loudspeaker drive units 2, 3, 4 emit a total acoustic power into the sound field 10 depending on the coupling to the sound field 10 from each driver position and the interaction between the drive units. Depending on the acoustic properties of the listening room/enclosure, more or less power averaged sound pressure will be created in the room/enclosure for a given acoustic power output into the sound field. In order to characterize the influence of the room on the sound field generated herein, the quantity room gain is introduced. Room Gain is here defined as the ratio between the squared power averaged sound pressure in a room and the acoustic power into this room.

A listener's access to the sound field 10, i.e. his ability to receive sound energy from a sound field and at the specific place herein in which he is located, depends on the coupling to the sound field at the actual listening position. A listener is in FIG. 1 schematically indicated by the head 6. This coupling can be described by the radiation resistance at the listening position, for instance measured by placing a loudspeaker (14 in FIGS. 3, 4 and 5) in the listening position and measuring the radiation resistance seen by this loudspeaker into the sound field.

Below follows a detailed description of methods for calculating the above three contributions to the total transmission path and how to determine an electronic filter for obtaining a specific target transmission from the electrical input to the loudspeakers to the ears of the listener.

Figure 2:
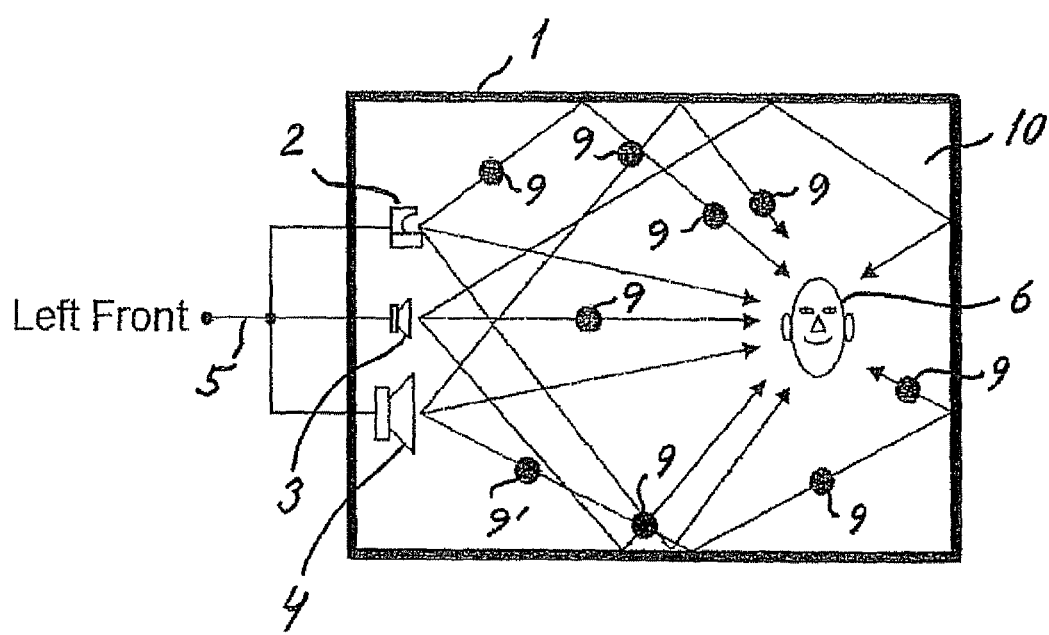
FIG. 2 shows sampling of energy or power in a sound field in a room.

FIG. 2 shows how the energy or power in a sound field can be measured by power averaging a number of measured sound pressures at random positions 9 scattered across the entire space in both x, y and z directions (length, width and height directions). It is understood that although the figures represent the sound field in only two dimensions, the actual field will of course be three-dimensional, and measurement points generally should be distributed throughout the three-dimensional space. Equation 1 below shows how to calculate the power averaged sound pressure. The number of random positions must be higher than 1 and in a preferred embodiment it will be 9 positions, but good results can be obtained with 4 positions.

$$p_{channel\_average} = \sqrt{\frac{\sum_{i=1}^{N} |p_{channel\_i}(f)|^2}{N}} \quad (1)$$

$p_{channel\_average}$ is the power averaged sound pressure for a given content channel, e.g. front left channel. $p_{channel\_i}$ is the measured transfer function from the input 5 to a power amplifier (not shown) to the sound pressure at the i'th random position, for instance the one designated by 9' in FIG. 2.

Figure 3:
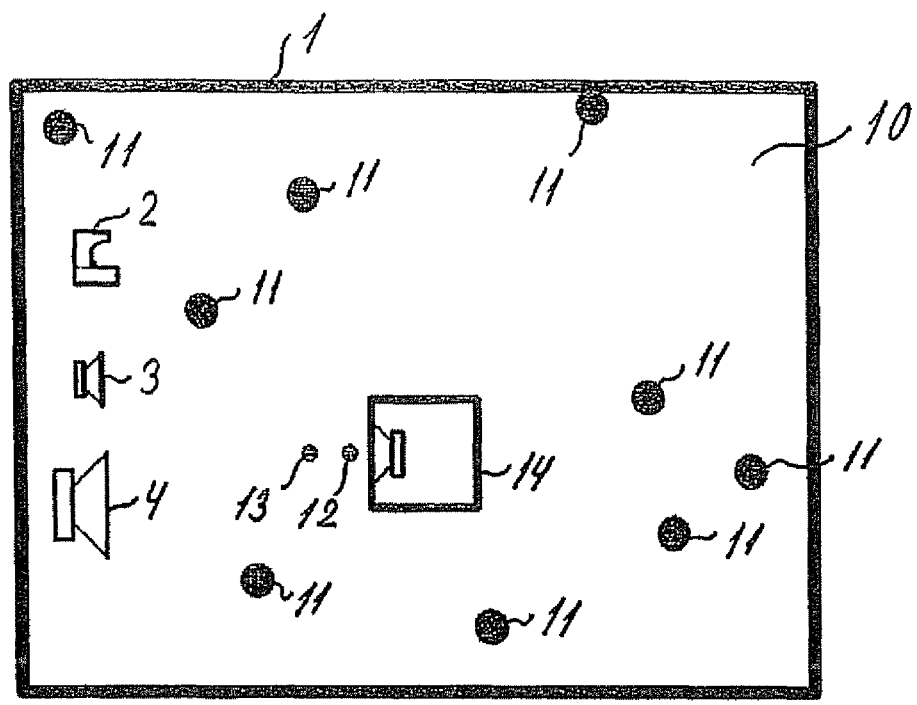
FIG. 3 shows the measurement of room gain in a room or enclosure by using a special measurement loudspeaker that could be placed at any position in the room or enclosure.

FIG. 3 illustrates a method of measuring the room gain in a room/enclosure by using a special measurement loudspeaker 14 that can be placed anywhere in the room.

After placing the special measurement loudspeaker 14 at a chosen position in the room/enclosure as shown in FIG. 3, sound pressure at a number of random positions 11 is measured while emitting acoustic signals through the measurement loudspeaker 14. Equation 2 shows how to calculate the power averaged sound pressure $p_{RG\_average}$ of the sound pressures at these random positions.

$$p_{RG\_average} = \sqrt{\frac{\sum_{i=1}^{N} |p_{RG\_i}(f)|^2}{N}} \quad (2)$$

Figure 4:
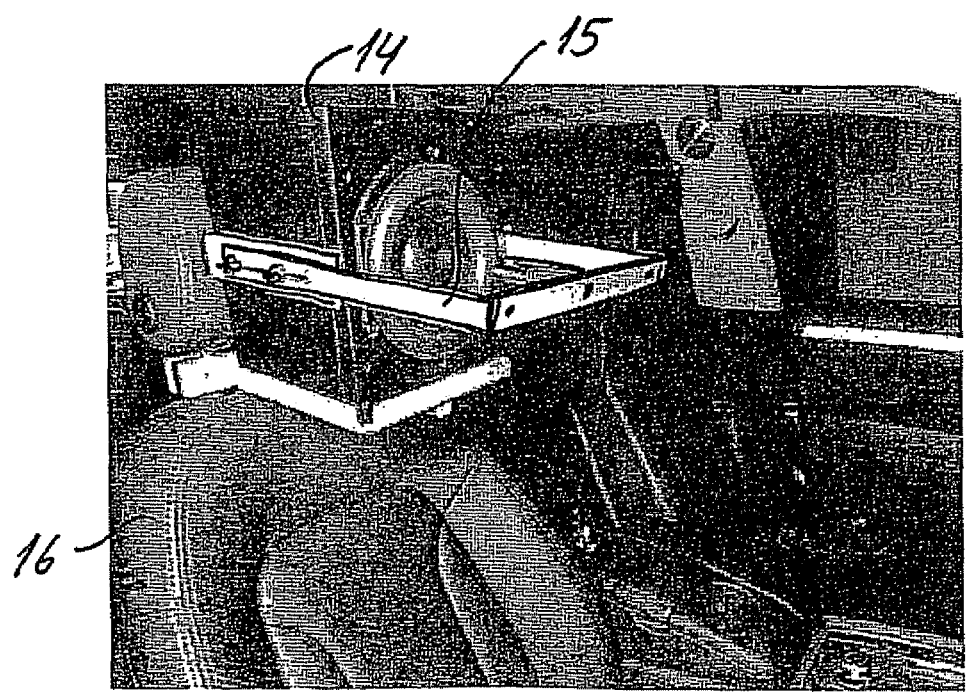
FIG. 4 shows an example of a special measurement loudspeaker placed in a ear at one of the listening positions. The measurement loudspeaker is fitted with special means to allow easy and reproducible measurement of sound pressure in two positions in the close near field of the loudspeaker diaphragm.

$p_{RG\_average}$ is the power averaged sound pressure when emitting acoustic signals through the special measurement loudspeaker 14 (the abbreviation RG stands for Room Gain). FIG. 4 shows a practical example of such a special measurement loudspeaker mounted at a specific location in an automobile cabin. $p_{RG\_i}$ is the transfer function between the inputs to the power amplifier to the measured sound pressure at the i'th random position, (It should be noted that throughout this specification, all generated sound pressures are normalised with respect to the input voltage to the respective amplifiers. It is hence correct to designate for instance the quantity $p_{RG\_i}$ as a transfer function).

While keeping the measurement loudspeaker 14 in the same position (see FIG. 3), the transfer function from the input of the power amplifier to the sound pressure at two positions 12 and 13 differently spaced from the loudspeaker diaphragm but both in the very near field of the diaphragm is then measured. The distance from the diaphragm to the closest position 12, in which position the sound pressure $p_1$ is measured, could be e.g. 4 cm while the distance to the other position, in which position the sound pressure $p_2$ is measured, could be 9 cm. Equation 3 shows how to calculate the mechanical radiation resistance, $R_{m,r}=Re(Zm,r)$, from the two sound pressures $p_1$ and $p_2$ in the near field of the measurement loudspeaker 14.

$$R_{m,r} = Re\left(j \cdot g \cdot f \cdot \frac{p_1}{p_1 - p_2}\right) \quad (3)$$

g is a real valued constant describing the scaling due to geometry etc. But g is unimportant in the application and can be set to 1.

FIG. 4 displays one example of a special measurement loudspeaker 14 placed in a car at one of the listening positions. The measurement loudspeaker 14 is fitted with special means 15 to allow easy and reproducible measurement of sound pressure in two positions in the close near field of the loudspeaker diaphragm.

After calculating the mechanical radiation resistance from equation 3 it is possible to calculate the acoustic power output using equation 4.

$$Pa_{RG\_actual} = \frac{1}{2} \cdot R_{m,r} \cdot |v_{RG}|^2 \quad (4)$$

$v_{RG}$ is the diaphragm velocity of the measurement loudspeaker, which can be estimated from the difference between the two near field sound pressures $p_1$ and $p_2$ as given in equation 5. As for the constant g mentioned above, h is also a real valued constant, which is a function of geometry, but which can be set to 1 here.

$$v_{RG} = h \cdot \frac{1}{j\omega} \cdot (p_1 - p_2) \quad (5)$$

The Room Gain in the actual room/enclosure can now be calculated from the definition given by equation 6.

$$\text{Room Gain} = \frac{p^2_{RG\_average}}{Pa_{RG\_actual}} \quad (6)$$

Figure 5:
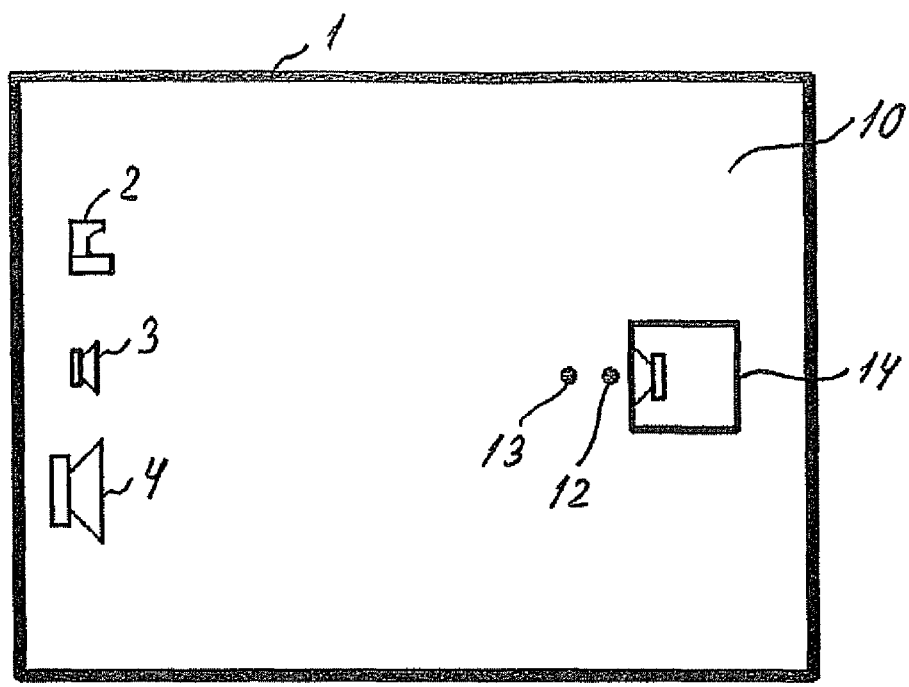
FIG. 5 shows measuring the listening position interface at a particular listening position.

FIG. 5 shows how the special measurement loudspeaker 14 is used to determine the listening position interface at a particular listening position. This measurement can be repeated for as many listening positions as desired. Individual filters can then be designed for each listening position or an average filter can be designed. According to a specific embodiment of the invention, the listening position interface filter is left out, whereby a global equalizing can then be designed. The listening position interface and the corresponding part of the speaker equalization filter, Listener(f), is hence to be regarded as an option.

The listening position interface is obtained from a similar measurement of two sound pressures at positions 12 and 13, respectively, in near field of the measurement loudspeaker. Again equation 3 can be used to calculate the mechanical radiation resistance from the two measured sound pressures.

Adaptive Sound Field Control Equalization Filters:

The total equalization filter is split into two main components: a speaker equalization filter and a listening position interface equalization filter as described in equation 7.

$$ASFC(f) = \text{Speaker}(f) \cdot \text{Listener}(f) \quad (7)$$

The speaker equalization filter ensures generation of a desired sound field in the room/enclosure while the listening position interface equalization filter compensates for the actual access to the generated sound field.

The total acoustic power output from the loudspeaker driver(s) for a given content channel can be calculated from the power averaged sound pressure and the measured Room Gain by using equation 8.

$$Pa_{channel\_actual} = \frac{p^2_{channel\_average}}{\text{Room Gain}} \quad (8)$$

Then the speaker equalization filter can be calculated from equation 9.

$$\text{Speaker}(f) = \sqrt{\frac{Pa_{Adaptive\ Target}(f)}{Pa_{channel\_actual}(f)}} \quad (9)$$

$Pa_{Adaptive\ Target}$ is a desired target function for the acoustic power output, which may be fixed, selectable or adaptive as a function of the measured total acoustic power output. This target function may also include the difference between a desired Room Gain and the actual Room Gain measured in the room/enclosure. A desired Room Gain may also be fixed, selectable or adaptive to the actual room. According to one embodiment of the invention, the desired Room Gain is equal to the actual Room Gain, i.e. preserving the natural Room Gain in the actual room. An alternative embodiment is to use a desired Room Gain equal to the Room Gain in a particular room of choice, e.g. an IEC 268-13 standard listening room.

A procedure of pre-shaping and aligning the response of the loudspeakers in the room/enclosure may precede all the measurements described in this document. This is equivalent to designing the basic loudspeaker in a particular room different or equal to the room of usage before applying this procedure for adapting to the actual room/enclosure of usage, E.g. a general trend of decreasing level with increasing frequency can be imposed onto the loudspeaker system before starting the described procedure for adapting the loudspeaker to the room/enclosure. Another example is performing dedicated equalization on a specific loudspeaker driver to correct known problems with that loudspeaker driver, which may be independent of the actual room of usage. Also specific equalization in the actual room/enclosure of usage may be applied before the room adaptation procedure is started.

Equation 10 gives the listening position interface equalization filter target.

$$\text{Listener}(f) = \sqrt{\frac{R_{m,r,reference\ listening\ position}(f)}{R_{m,r,actual\ listener\ position}(f)}} \quad (10)$$

The radiation resistance in a reference listening position, $R_{m,r,reference\_listening\_position}$ can be measured in a listening position where the access to the sound field is considered to be optimal. E.g. a listening position where the step of pre-shaping and equalization before the procedure of adapting to the room/enclosure is optimized may be used for this reference. A preferred embodiment is, however, to use $R_{m,r,reference\_listening\_position}$ equal to the radiation resistance in free field because in free field, a listener has equal access to all frequencies. The theoretical radiation resistance in free field for a point source is frequency squared multiplied by a constant depending on geometry.

Equation 11 now gives the complete equalization filter for an Adaptive Sound Field Control (ASFC) system according to the described embodiment of the invention, $$ASFC(f) = \sqrt{\frac{Pa_{Adaptive\ Target}(f) \cdot R_{m,r,reference\ listening\ position}(f)}{Pa_{channel\_actual}(f) \cdot R_{m,r,actual\ listener\ position}(f)}} \quad (11)$$

A special case is when no specific listening position is considered, i.e. equalization globally valid to the whole room/enclosure. Then the total equalization filter reduces to the speaker equalization filter, as in equation 12.

$$ASFC(f) = \sqrt{\frac{Pa_{Adaptive\ Target}(f)}{Pa_{channel\_actual}(f)}} \quad (12)$$

Real Time Adaptation

Another aspect of the present invention is the possibility of real time adaption to any changes of loudspeaker drivers and acoustic properties of the room/enclosure, Loudspeaker drivers are known to change as a function of aging and environment changes like temperature and humidity. Also playing loud music will heat the loudspeaker drive units and in particular the voice coils, which will also change the characteristics of the drive units.

Changing the acoustic properties of the room/enclosure can occur for numerous reasons, for instance as a consequence of how many people are present in the room/enclosure, opening or closing a window/door, opening or closing the roof in a car, fitting more or less furniture/baggage etc. into the room/enclosure. Using room adaptation according to the present invention provides a new possibility of tracking such changes in real time. The whole procedure can be repeated under different configurations, e.g. open/closed windows, and the corresponding equalization filters can be stored and selected manually or automatically when the same configuration happens during use. Alternatively, the whole or a part of the procedure can be performed during actual use in the actual configuration.

According to a preferred embodiment of the present invention, a subset of the random positions is chosen that has been proved to contain the major part of information obtained by the full set of random positions. Experiments show that a subset of 3 positions can be selected to track the changes due to changes in loudspeaker drive units and/or acoustic properties in the room/enclosure. This is shown in FIG. 6.

The three positions are sufficient when combining with the knowledge obtained in the full set of random positions in an initial design or calibration step. The initial or calibration step may be a collection of measurements in different configurations that can be manually selected or automatically selected when the configuration changes.

Figure 6:
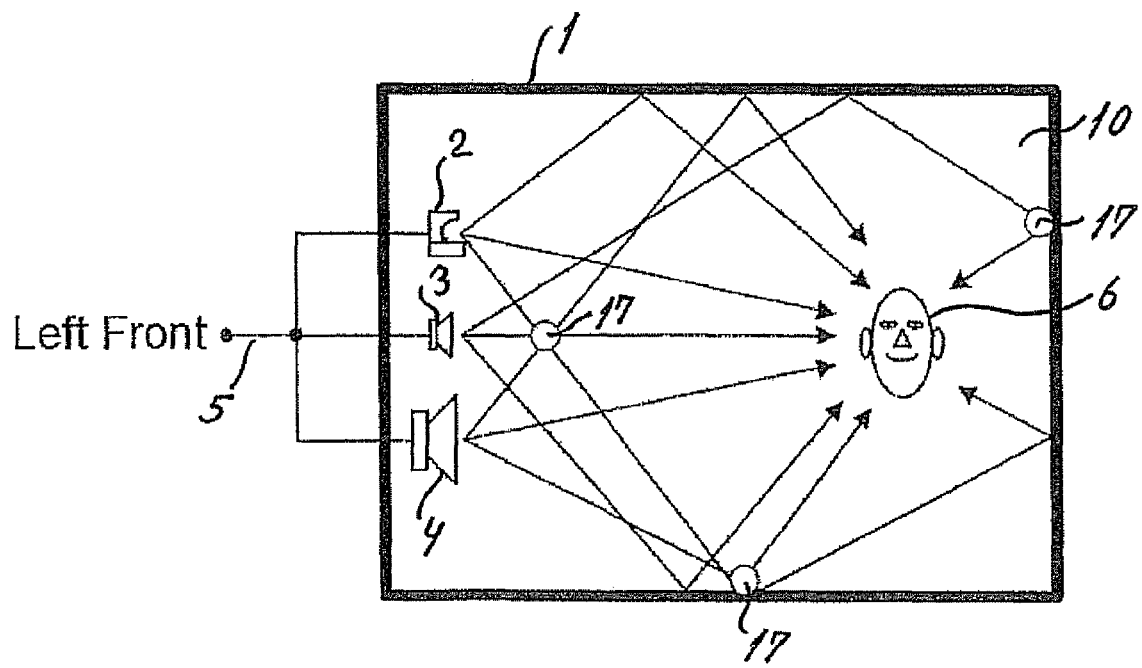
FIG. 6 shows real time adaptation that tracks changes of the energy or power in the sound field based on measurements of sound pressure at a subset of random positions, for instance three positions as shown in this figure.

FIG. 6 shows a real time adaptation tracking changes from measurement of sound pressure at a subset of random position, e.g. three positions.

In order to be able to carry out the adaptation in real time, i.e. during actual operation of for instance an automobile, those parts of the filter that are determined by means of the dedicated measurement loudspeaker 14 either located at the described position used for determining room gain RG(f) or for determining the listening position interface, are preferably pre-recorded during an initial or calibration phase, as the measurement of p1 and p2 in front of the measurement loudspeaker and/or the use of a measurement loudspeaker at different positions in the enclosure would be difficult or in some situations even impossible to implement during actual operation. Hence, according to a preferred embodiment of the invention, in an initial or calibration phase these quantities are determined for all relevant conditions in the particular enclosure, whereas the acoustic power output from the one or more loudspeakers 2, 3, 4 can be estimated during actual operation, for instance by means of the simplified three-microphone setup shown in FIG. 6, which only applies three microphones, whereas a larger number of microphones (or measurement positions) is typically used in the initial or calibration phase. With reference to FIGS. 2 and 3, respectively, nine measurement positions are used in this phase.

For instance, an event can activate the adaption procedure to take place. The event is a trigger to start the adaption algorithm and to perform the measurements, with the three microphones for instance, the calculations and the adjustments accordingly. The trigger may be of different types according to actual product requirements e.g. but not limited to: a) automatically when the car is entered or the engine is started, or b) upon a specific control command given by the user.

The command given by the user may be e.g. a pressure on button, a touch on a touch panel, a spoken command or a given gesture from a hand or the like.

The information about the mode of the adaption procedure may be displayed, with an indication of the transition from off->initiated->completed->active. The type of display may e.g. be a LCD screen, an OLED panel, an LED or the like.

In the preferred embodiment, a combined key input device (switch button) and display device (an LED with multiple colour mode indications) constitute the user interface to the adaption procedure.

The invention claimed is:

1. A method for determining an equalization filter for one or more loudspeakers provided in an enclosure, such as a listening room or an automobile cabin, the method comprising the steps of:

providing said one or more loudspeakers with an audio input signal whereby a sound field is generated in the enclosure, a power averaged sound pressure emitted from the one or more loudspeakers into said enclosure by power averaging a number of measured sound pressures at a number N of positions in the enclosure;

determining an acoustic contribution or room gain RG(f) of the enclosure to the generated sound field, by
placing a measurement sound source at a measurement position in said enclosure;
measuring sound pressures $p_1$ and $p_2$, respectively, at two positions in the near field of the measurement sound source;
based on the measured sound pressures at said two positions, calculating a mechanical radiation resistance in the near field of the measurement sound source;
based on said radiation resistance, calculating the acoustic contribution or room gain RG(f);

forming a speaker equalization filter Speaker(f) as the square root of the ratio between a target acoustic power output and the actual acoustic power output from the loudspeaker driver(s) of the respective one or more loudspeakers, which actual acoustic power output is calculated as the square of the power averaged sound pressure divided by the room gain RG(f); and determining said equalization filter as said speaker equalization filter Speaker(f).

2. A method according to claim 1, wherein said acoustic contribution or room gain RG(f) of the enclosure to the sound field in the enclosure is determined by further carrying out the following steps:

measuring sound pressure at M positions while emitting an acoustic signal by means of said measurement sound source;

calculating the power averaged sound pressure of said sound pressures at said M positions;

based on said radiation resistance, calculating the acoustic power output from the measurement sound source; and calculating said acoustic contribution or room gain RG(f) of the enclosure to the generated sound field as the ratio between the square of the power averaged sound pressure of the sound pressures at said M positions and said acoustic power output from the measurement sound source.

3. A method according to claim 1, further comprising:
determining a listening position interface equalization filter Listener(f) for a specific listening position in the sound field by:
placing a measurement sound source at this specific listening position in said enclosure, and
measuring sound pressures p1 and p2, respectively, at two positions and respectively, in the near field of the measurement sound source,
based on the measured sound pressures at said two positions, calculating a mechanical radiation resistance in the near field of the measurement sound source;
determining the listening position interface equalization filter as the square root of a ratio between the mechanical radiation resistance determined at a reference listening position and the mechanical radiation resistance determined at said specific listening position; and determining said equalization filter as the product of said speaker equalization filter Speaker(f) and said listening position interface equalization filter Listener(f).

4. A method according to claim 3 wherein said reference listening position is a position in free field.

5. A method according to claim 1, comprising the steps of:
during an initial or calibration phase, measuring said acoustic contribution or room gain RG(f) and optionally the listening position interface for different conditions of said enclosure and storing the measurement results in storage means;
during said initial or calibration phase determining said power average of measured sound pressures for one or more of said different conditions of said enclosure and storing the measurement results in storage means; or during said initial or calibration phase determining said power average of measured sound pressures for one condition, such as a reference condition, of said enclosure and storing the measurement result in storage means and during actual use of the loudspeakers in the enclosure carrying out measurements of said sound pressures for up-dating the power averaged sound pressures, thereby to carry out up-dating of said equalization filter to correspond to changed conditions of the enclosure.

6. A method according to claim 5, wherein a number $N_u$ of measurement positions used for real-time updating of the filter characteristic is less than the corresponding number N used in the initial or calibration phase.

7. A method according to claim 6, wherein $N_u$ is equal to 3.

8. A method according to claim 1, wherein said enclosure is the cabin of vehicle, such as a car.

9. A system for determining an equalization filter for one or more loudspeakers provided in an enclosure, such as a listening room or an automobile cabin, the system comprising:
one or more microphones for measuring sound pressure at a number of different positions in a sound field in an enclosure;
a measurement sound source that can be placed at chosen positions in said sound field in said enclosure;
means for determining a power averaged sound pressure emitted from the one or more loudspeakers into said enclosure by power averaging a number of measured sound pressures at said positions;
means for determining an acoustic contribution or room gain RG(f) of the enclosure to the generated sound field based on a sound signal emitted by said measurement sound source and the measurement of sound pressure at two positions at different distances from the measurement sound source in the near field of a sound field generated by said measurement sound source;
means for forming a speaker equalization filter (Speaker (f)) as the square root of a ratio between a target acoustic power output and the actual acoustic power output from the loudspeaker driver(s) of the respective one or more loudspeakers, which actual acoustic power output is calculated as the square of the power averaged sound pressure divided by the room gain RG(f); and
means for determining the equalization filter as said speaker equalization filter Speaker(f).

10. A system according to claim 9, further comprising means for storing said speaker equalization filter, Speaker(f), and optionally a listening position interface equalization filter, Listener(f) corresponding to different conditions of said enclosure.

11. A system according to claim 10, further comprising a set of microphones that can carry out real time measurements of sound pressure during use of the enclosure and use these measurements together with quantities stored in said means for storing, to determine real time changes of said equalization filter or said speaker equalization filter, Speaker(f), and optionally a listening position interface equalization filter, Listener(f).

12. A system according to claim 10, further comprising means for triggering said real time changes of said equalization filter, for instance when the acoustic properties of the enclosure change, or when the acoustic properties of the loudspeakers that create the acoustic field in the enclosure change.

13. A system according to claim 12, wherein said triggering is performed manually by an operator, such as by the driver or a passenger in a car.

14. A system according to claim 12, wherein said triggering is performed automatically, for instance by opening of a window in a car or when the number of persons in the cabin is changed.

15. The system according to claim 9, wherein said enclosure is the cabin of vehicle, such as a car.

16. The system in claim 9, further comprising means for determining a listening position interface equalization filter Listener(f) for a specific listening position in the sound field by:
calculating a mechanical radiation resistance in the near field of the measurement sound source based on measured sound pressures at two positions in the near field of the measurement sound source placed in a specific listening position in said enclosure, and
determining the listening position interface equalization filter Listener(f) as the square root of a ratio between the mechanical radiation resistance determined at a reference listening position and the mechanical radiation resistance determined at said specific listening position; and
wherein said means for determining said equalization filter are arranged to determine said equalization filter as the product of said speaker equalization filter Speaker(f) and said listening position interface equalization filter Listener(f).

17. A system according to claim 16, further comprising means for storing those quantities that are derived from measurements of said sound pressures in the enclosure and that are used for determining the speaker equalization filter, Speaker(f), and said listening position interface equalization filter, Listener(f).

* * * * *